United States Patent
Demand et al.

(10) Patent No.: US 7,390,708 B2
(45) Date of Patent: Jun. 24, 2008

(54) PATTERNING OF DOPED POLY-SILICON GATES

(75) Inventors: Marc Demand, Saint-Jean-Geest (BE); Denis Shamiryan, Leuven (BE); Vasile Paraschiv, Kessel-lo (BE)

(73) Assignee: Interuniversitair Microelektronica Centrum (IMEC) vzw, Leuven (BE)

( * ) Notice: Subject to any disclaimer, the term of this patent is extended or adjusted under 35 U.S.C. 154(b) by 0 days.

(21) Appl. No.: 11/876,617

(22) Filed: Oct. 22, 2007

(65) Prior Publication Data

US 2008/0096372 A1     Apr. 24, 2008

Related U.S. Application Data

(60) Provisional application No. 60/945,864, filed on Jun. 22, 2007, provisional application No. 60/853,895, filed on Oct. 23, 2006.

(51) Int. Cl.
*H01L 21/336* (2006.01)
*H01L 21/8234* (2006.01)

(52) U.S. Cl. .................... 438/197; 438/199

(58) Field of Classification Search ............... 438/199, 438/197
See application file for complete search history.

(56) References Cited

U.S. PATENT DOCUMENTS

| 6,682,999 B1 * | 1/2004 | Mucha ............... 438/620 |
| 2006/0163665 A1 * | 7/2006 | Chuang et al. ........ 257/374 |
| 2007/0004224 A1 * | 1/2007 | Currie ............... 438/778 |
| 2007/0010037 A1 * | 1/2007 | Li et al. ............. 438/29 |
| 2007/0057335 A1 * | 3/2007 | Tsuchiya et al. ...... 257/412 |
| 2007/0099385 A1 * | 5/2007 | Nakajima et al. ...... 438/283 |

FOREIGN PATENT DOCUMENTS

JP    20070161952 A * 6/2007

* cited by examiner

*Primary Examiner*—Thao X. Le
*Assistant Examiner*—Eric W Jones
(74) *Attorney, Agent, or Firm*—Knobbe Martens Olson & Bear LLP

(57) ABSTRACT

A method is provided for the patterning of a stack comprising elements that do not form volatile compounds during conventional reactive ion etching. More specifically the element(s) are Lanthanide elements such as Ytterbium (Yb) and the patterning preferably relates to the dry etching of silicon and/or germanium comprising structures (e.g. gates) doped with a Lanthanide e.g. Ytterbium (Yb doped gates). In case the silicon and/or germanium comprising structure is a gate electrode the silicon and/or germanium is doped with a Lanthanide (e.g. Yb) for modeling the work function of a gate electrode.

15 Claims, 5 Drawing Sheets

PRIOR ART
PRIOR ART
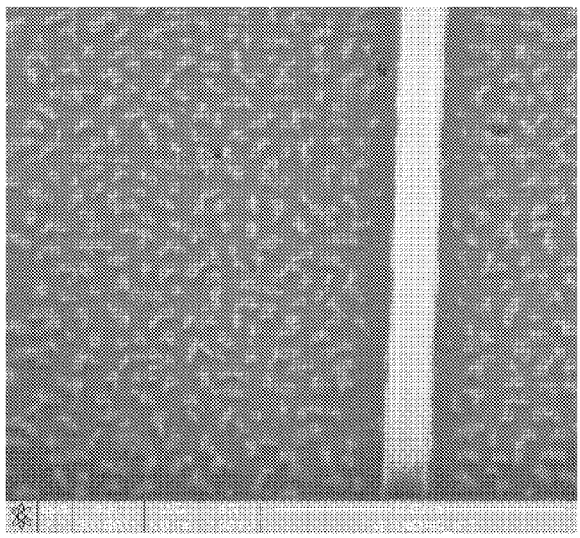
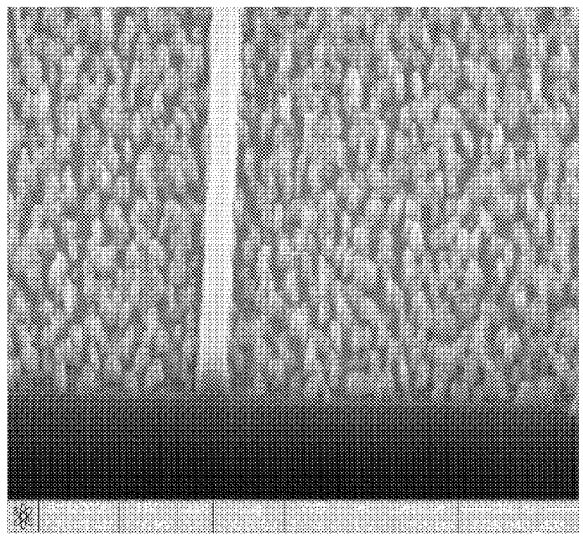
Figure 1A
Figure 1B

Figure 3
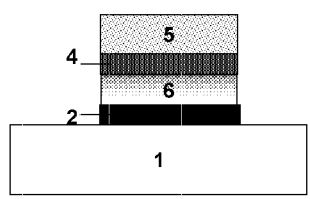
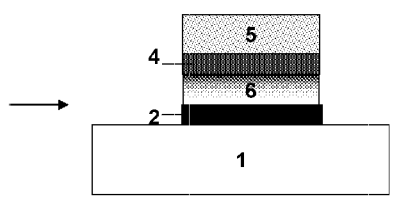
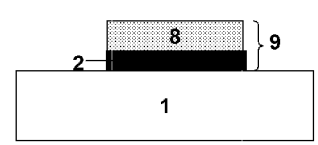
Figure 3G          Figure 3H          Figure 3I

PATTERNING OF DOPED POLY-SILICON GATES

CROSS-REFERENCE TO RELATED APPLICATIONS

This application claims the benefit under 35 U.S.C. § 119 (e) of U.S. provisional application Ser. No. 60/945,864, filed Jun. 22, 2007, and U.S. provisional application Ser. No. 60/853,895, filed Oct. 23, 2006, the disclosures of which are hereby expressly incorporated by reference in their entirety and are hereby expressly made a portion of this application.

FIELD OF THE INVENTION

Methods according to preferred embodiments are related to the field of semiconductor processing. More specifically it is related to the patterning of poly-Silicon (Poly-Si) doped with an element that does not form volatile compounds during conventional reactive ion etching. Methods according to preferred embodiments are further related to a method to pattern Ytterbium (Yb) doped poly-Si (gates) or in other words makes it possible to etch Yb doped poly-Si gates using a combination of dry and wet etching.

BACKGROUND OF THE INVENTION

The transistor's work function can be modulated using dopants in combination with fully silicided gates. The use of an activation anneal of these dopants has been shown to have a strong effect on the work function modulation achieved. Aluminum (Al) can be used as dopant to fabricate poly-Si gate for p-MOS transistors whereas Ytterbium (Yb) doped poly-Si gate will be used for n-MOS transistors. In the complementary MOS (CMOS) transistor flow, the gates might receive the implants (Yb and Al) before the gate patterning or just before the silicidation. In the former case they can receive the anneal from the junction anneal, whereas in the latter case they will not get an activation anneal because the integrity of the NiSi source drain regions could not be preserved.

Since Yb is not likely to form volatile compounds during dry etching the problem is the selective etching of Yb doped gates without leaving residues leading to unwanted micromasking.

SUMMARY OF THE INVENTION

A method for etching poly-Si gates implanted with an element that does not form volatile compounds during conventional reactive ion etching such as Ytterbium (Yb) is provided.

Also provided is a method for patterning a gate structure comprising Lanthanide elements (e.g. Ytterbium) using a combination of a dry etch plasma and a wet removal step thereby avoiding micromasking and unwanted residues.

According to preferred embodiments a method is provided for the removal of at least part of a layer thereby avoiding the presence of residues and wherein the layer is characterized as having a matrix (main composition) in which elements are incorporated that do not form volatile compounds during conventional reactive ion etching. More specifically the element(s) are present in the matrix at concentrations lower than 1% and the elements can not be removed during conventional reactive ion etching and therefore remain as residues afterwards. To perform the method according to preferred embodiments, the elements must be able to form water soluble chlorides and/or bromides. Examples of such elements are Lanthanide elements such as Ytterbium (Yb). The main composition of the layer to be etched can be any layer.

According to preferred embodiments, the method may be used for partial removal of a layer e.g. when a structure needs to be etched in a layer. In that case the main composition of the layer or matrix should be resistant to water or in other words not soluble in water and/or water based solutions.

The method according to preferred embodiments is a non-obvious combination of patterning a structure in a layer simultaneously with the chlorination (bromination) of (non-etchable) elements which are present in a minor concentration in the layer such that a water soluble compound is formed which can be removed in a next step by a water rinse. The minor concentration of the element may be a dopant such as Yb in a concentration of $4^{15}$ atoms/cm$^2$ up to $8^{15}$ atoms/cm$^2$ in a poly-Si matrix for gate application in a semiconductor device.

According to preferred embodiments, the method may be used for complete removal of a layer thereby avoiding the presence of residues and resulting in a smooth surface after removal of the layer. In that case the substrate underneath the layer should be resistant to water or in other words not soluble in water and/or water based solutions.

According to preferred embodiments, a method is provided for the patterning of a stack of layers whereby at least one of the layers of the stack are comprising elements that do not form volatile compounds during conventional reactive ion etching. More specifically the element(s) are Lanthanide elements such as Ytterbium (Yb) and the patterning preferably relates to the dry etching of silicon and/or germanium comprising structures (e.g. gates) doped with a Lanthanide e.g. Ytterbium (Yb doped gates). In case the silicon and/or germanium comprising structure is a gate electrode the silicon and/or germanium is doped with a Lanthanide (e.g. Yb) for tuning the work function of a gate electrode.

According to preferred embodiments a method is disclosed for the patterning of a Si, Ge or SiGe comprising gate electrode layer further comprising one or more lanthanide dopants in a semiconductor device. The method comprises at least the steps of first providing a substrate comprising a gate dielectric layer and depositing a gate electrode layer onto the gate dielectric layer. In a next step the gate electrode layer is doped with a suitable doping element (dopant). The dopant is characterized as a Lanthanide element which does not form volatile compounds during conventional reactive ion etching such as Ytterbium (Yb). In a next step a mask structure is developed onto the gate electrode layer to define a gate structure and to expose part(s) of the gate electrode layer. Subsequently the exposed parts of the gate electrode layer are chlorinated and/or brominated using a Cl and/or Br comprising plasma such that the dopant is chlorinated and/or brominated. The Cl and/or Br comprising plasma may not contain F. In a next step the chlorinated (brominated) doping elements (dopants) are removed using a wet etch step. Since Lanthanide chlorides and Lanthanide bromides are water soluble, the wet etch step is a water rinse or alternatively a rinse using an acidified water based solution. An example of an acidified solution can be HCl in water wherein the HCl concentration can range from 1-2% till 10-20%. To complete the gate patterning, the substrate is then transferred to the dry etch chamber to perform dry etch step to etch the remaining part of the gate electrode layer and optionally gate dielectric layer.

To distribute the dopant, an anneal step is performed, the anneal step is preferably a thermal anneal. The anneal step is performed after the step of (selectively) removing the chlorinated (brominated) dopants and after the step of patterning the complete gate electrode.

Preferably the step of subjecting the exposed parts of the gate electrode layer to a Cl and/or Br comprising plasma is performed in a dry etch chamber using an anisotropic dry-etch plasma. The dry etch chamber can be the same etch chamber in which the patterning of the gate structure is completed.

Preferably the step of subjecting the exposed parts of the gate electrode layer is performed by an anisotropic dry-etch plasma during the step of patterning the gate electrode layer using a Cl (Br) comprising plasma whereby during the etching the exposed portions of the gate dielectric layer gets chlorinated or brominated.

Preferably the Cl (Br) comprising plasma is a plasma comprising $Cl_2$, HBr and/or $BCl_3$. A plasma (not ambient) is needed to create reactive species of Cl and/or Br such that chemical bonds can broken and new bonds can be created. Inert compounds such as Argon (Ar) can be added e.g. to dilute the plasma.

Preferable the substrate is a silicon wafer.

In an alternative embodiment and also preferred an interlayer is deposited onto the substrate before depositing the gate dielectric layer.

Preferably the substrate bias during the step of subjecting the exposed parts of the gate electrode layer to a Cl or Br comprising plasma is 75 W to 300 W.

Preferably the plasma power during the step of subjecting the exposed parts of the gate electrode layer to a Cl or Br comprising plasma is in the range of 100 W up to 1200 W.

More preferred the plasma power during the step of subjecting the exposed parts of the gate electrode layer to a Cl or Br comprising plasma is around 250 W.

Preferably the pressure in the plasma during the step of subjecting the exposed parts of the gate electrode layer to a Cl (Br) comprising plasma is minimum 5 mT (0.666 Pa) and maximum 80 mT (10.665 Pa).

More preferred the pressure in the plasma during the step of subjecting the exposed parts of the gate electrode layer to a Cl (Br) comprising plasma is 6 mT (0.799 Pa).

The method according to preferred embodiments is illustrated for the patterning of a gate electrode structure but is applicable to pattern any silicon and/or germanium comprising layer having a (doping) element or an element which is present in minor concentration in a matrix as long as the element is able to form soluble chlorides and/or bromides.

The method according to preferred embodiments for the patterning of a stack of layers using a combination (sequence) of wet etch and dry etch techniques is also referred to as a "dry-wet-dry" etch approach.

BRIEF DESCRIPTION OF THE DRAWINGS

All drawings are intended to illustrate some aspects and preferred embodiments. Not all alternatives and options are shown and therefore the invention is not limited to the content of the given drawings.

FIG. 1A illustrates a tilted SEM picture of an Yb-doped poly-Si gate after etch using conventional poly-Si gate etch recipe. FIG. 1B illustrates a tilted SEM picture of an Yb-doped poly-Si gate after etch using a conventional poly-Si gate etch recipe and an anneal in $N_2$ at 900° C. to distribute the Yb in the poly-Si layer.

DETAILED DESCRIPTION OF THE PREFERRED EMBODIMENT

Figure 2:
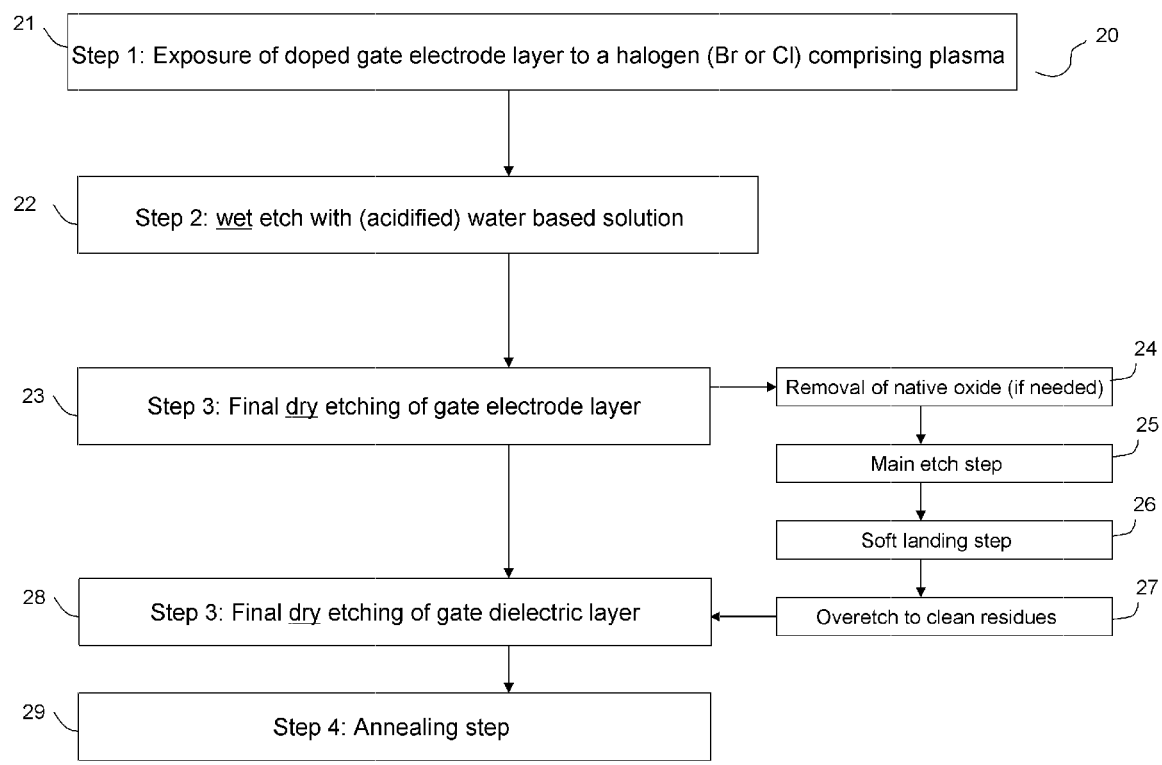
FIG. 2 illustrates a flowchart according to a preferred embodiment to perform the dry/wet/dry etch approach for patterning of poly-Si doped with almost non-volatile elements (e.g. Yb).
Figure 3F:
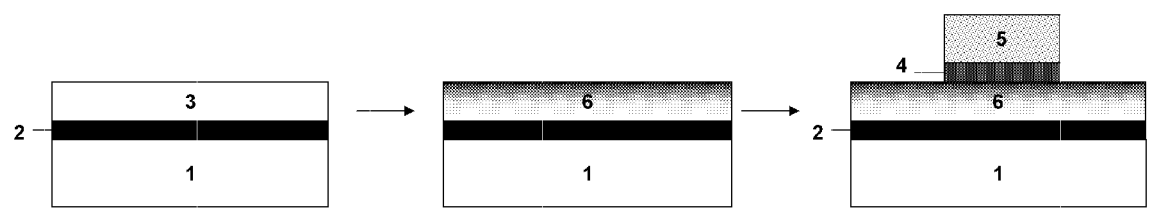
FIG. 3A up to FIG. 3I illustrate the different processing steps according to a preferred embodiment to perform the dry/wet/dry etch approach for patterning of poly-Si doped with almost non-volatile elements (e.g. Yb).
Figure 3F:
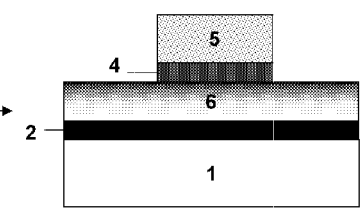
Figure 3F:
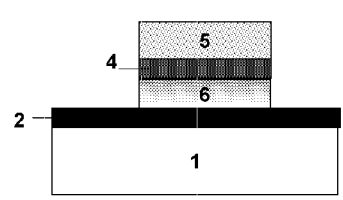
Figure 3E:
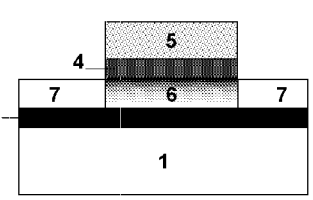
Figure 3D:
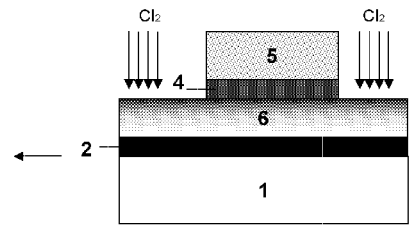
Figure 4:
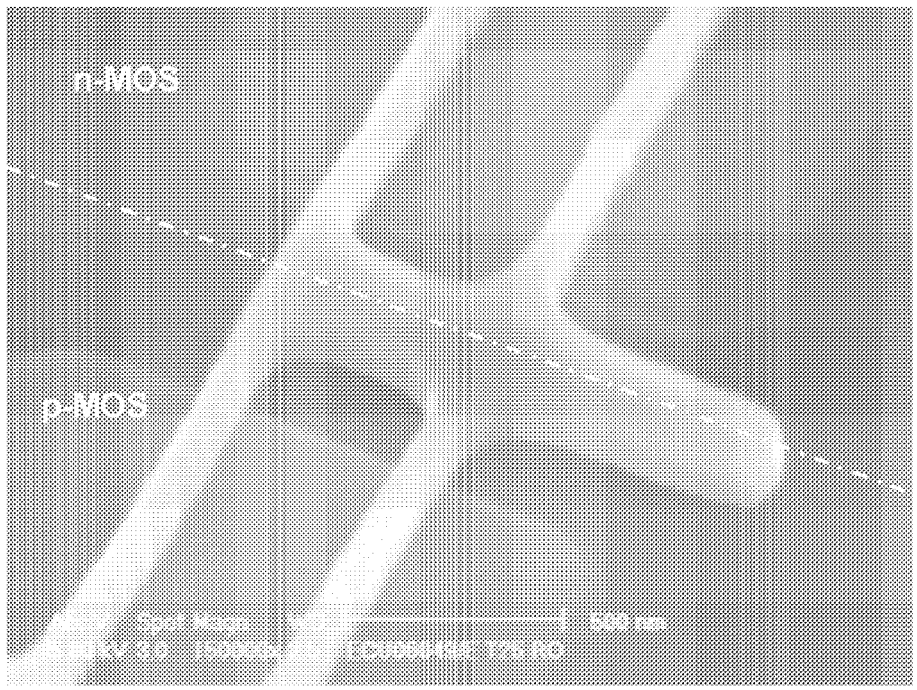
FIG. 4 shows a tilted SEM of a ring oscillator structure where the poly-Si is Yb-doped for n-MOS and Al-doped for p-MOS after full dry-wet-dry etch process according to the preferred embodiments.

In relation to the drawings the present invention is described very briefly and general in the sequel. It is apparent, however, that a person skilled in the art knows how to perform the etch process in detail and compose an etch recipe.

According to preferred embodiments, the term substrate bias refers to the voltage applied to the substrate in a Reactive Ion Etching (RIE) chamber. This value is expressed in Watts. The absence of substrate bias (Bias=0) gives substantially no ion bombardment meaning almost no etching behavior. To achieve a vertical treatment (or exposure) of the substrate by the plasma, a substrate bias is preferred to avoid lateral etch of the structures due to exposure to plasma components.

According to preferred embodiments, the term "anisotropic etch" refers to the etching process in which etch rate in the direction perpendicular to the surface (or substrate) is much higher than in direction parallel to the surface (or substrate). This in contrast to "isotropic etch" in which the etching occurs the same in any direction or being non-directional.

According to preferred embodiments, the term "micromasking" refers to and is observed when a number of the residuals behave as if they were tiny islands of etch-resisting material which prevent the underlying layer from being etched and hence act as a mask. Additionally, if a continuous string of such micromasking nodules occurs undesired electrical shorts may occur. Even if complete shorts are not formed, critical electrical attributes such as current leakage may be adversely affected by micromasking.

According to preferred embodiments, the term Lanthanides refers to the 15 elements with atomic numbers 57 through 71, from lanthanum to lutetium More specifically and as an example it refers in this application to Lanthanides used for doping to achieve an n-type (p-type) doping of e.g. poly-silicon.

According to preferred embodiments "integrated circuit" includes devices formed on semiconducting substrates, such as group IV materials like silicon or germanium, or group III-V compounds like gallium arsenide, or structured substrate such as silicon-on-insulator, strained silicon and silicon-germanium, or mixtures of such materials. The term includes all types of devices formed, such as memory and logic, and all designs of such devices, such as MOS and bipolar. The term also comprehends applications such as flat panel displays, solar cells, and charge coupled devices.

According to preferred embodiments, the problem of micromasking occurring during the patterning of poly-silicon gates doped with Lanthanides such as Ytterbium (Yb) using reactive ion dry-etching techniques is solved. More specifically the problem is the removal of the dopant residues during the patterning thereby avoiding micromasking. The dry-etching of the Lanthanides is hardly possible at close to room temperatures due to very low volatility of Lanthanides. For example the melting point of Yb is around 824° C. which is far too high to perform reactive ion etching.

It is therefore an object to provide a method for patterning of a stack of layers (e.g. a gate stack layer) comprising elements (e.g. dopants) which are hardly impossible to remove by dry etching. More specifically a method is disclosed to allow selective removal of Lanthanide dopants using semiconductor compatible process technology steps.

According to a preferred embodiment a method is provided for the removal of at least part of a deposited layer selectively over a substrate underneath. The deposited layer comprises elements which are not etchable using conventional wet and dry etching techniques. The method comprises at least the step of first providing a substrate and depositing the deposited layer comprising elements which are able to form water-soluble chlorides and/or bromides onto the substrate. In a next step the elements are chlorinated and/or brominated by at least exposing the deposited layer to a Cl and/or Br comprising dry etch plasma. In a next step the chlorinated and/or brominated elements can be removed using a water based wet etch step. The remaining part of the deposited layer can then be further etched to the desired ratio by performing a conventional state of the art dry etch step.

According to preferred embodiments a method for forming (patterning) a structure in at least one layer (or a stack of layers) on a semiconductor substrate is provided. More specifically the structure can be a gate structure. A layer is first deposited onto a substrate and doped with a suitable dopant. The dopant is preferably a Lanthanide such as Yb. Subsequently the deposited layer is then patterned with a suitable mask to define a structure in the deposited layer and to expose portions of the deposited layer. The exposed portions of the deposited layer are then subjected to a Cl or Br comprising plasma that causes chlorination (or bromination) of the dopant in the exposed portions of the deposited layer. The Cl or Br comprising plasma is preferably an in-situ plasma comprising Cl and/or Br species (and does not comprise F species). The chlorinated (brominated) portions of the dopants can be selectively wet etched. The wet etch is preferably a water based rinse (optionally acidified water can be used). After removal of the chlorinated (brominated) dopants, the patterning of the structure is completed using dry etching techniques. Finally the dopants in the patterned structure need to be distributed using an anneal. Most preferred the anneal step is a thermal anneal.

According to preferred embodiments a method is disclosed to pattern a stack of layers whereby at least one of the layers comprises a Lanthanides, preferably the stack of layers are gate stack layers. The stack of layers is situated or deposited onto a substrate, most preferred the substrate is a semiconductor substrate e.g. silicon wafer. The aim of the patterning is to pattern or to form a gate structure in the gate stack layers. The gate structure comprises at least one gate electrode (layer) and at least one gate oxide (layer) situated below the gate electrode layer.

Optionally an interlayer can be deposited onto the substrate before depositing the gate stack layers, the interlayer can be a thermally grown $SiO_2$ layer. The thermally grown $SiO_2$ can be formed by subjecting the (silicon) substrate to a HF dip (2% HF for a few minutes).

Most preferred the gate stack layer used to form the gate electrode is a silicon and/or germanium comprising layer such as a polycrystalline-silicon (poly-Si) layer.

Most preferred the gate stack layer used to form the gate oxide (also referred to as gate insulator or gate dielectric) is a high-k layer but other suitable gate oxide layers are also possible (e.g. $SiO_2$, SiON).

According to preferred embodiments the problem of patterning of gate electrode layers doped with one or more Lanthanide elements to tune the workfunction of a gate electrode, more specifically the selective removal of Lanthanides in a gate electrode layer during patterning of a gate structure is solved. Dry removal is impossible since Lanthanides do not form volatile compounds within the temperature ranges used during reactive ion etching (plasma etching).

According to preferred embodiments the problem of micromasking originating from Lanthanide residues during the patterning is solved by first performing a chlorination (bromination) step using a dry-etch plasma such that Lanthanide chlorides and or Lanthanide bromides are formed (e.g. $YbCl_3$) which are water soluble. The chlorination (bromination) step is performed after the creation of a mask structure such that only the exposed areas are chlorinated (brominated). In a second step the Lanthanide halides are selectively removed from the substrate using a wet removal step. The wet removal step is preferably performed using a deionized water rinse or alternatively a rinse with acidified water.

According to preferred embodiments the problem is solved by chlorinating (brominating) the Lanthanides by means of a Cl and/or Br containing plasma (e.g. $Cl_2$, HBr, $Br_2$ and/or $BCl_3$).

According to preferred embodiments the advantage of selective removal of Lanthanide halides only in the exposed areas and hence not under the areas protected by a (hard) mask used for patterning the gate structure is disclosed. Preferred methods furthermore provides the advantage of avoiding or eliminating the removal of non-chlorinated (non-brominated) Lanthanides because these are not water soluble and hence only the chlorinated (brominated) Lanthanides are removed by means of a wet rinse (water). Since the plasma chlorination (bromination) is anisotropic, the areas of the gate electrode layer which are situated under the mask structure are not exposed and hence not chlorinated (brominated) and, therefore, not removed by water.

In a preferred embodiment the chlorination or alternatively bromination step is performed after the step of doping the gate electrode layer and before the step of annealing the gate electrode layer such that the dopant elements are located in the upper (or top) region of the gate electrode layer.

The chlorinated (brominated) dopant elements can be removed by performing a wet removal step. In case the dopant element is a Lanthanide such as Yb, the wet removal of Yb-chlorides (or Yb-bromides) is preferably a water based removal, most preferred the removal is a water rinse.

It has been found through experimentation that the wet residue removing step removed essentially all of the exposed micromasking nodules. As a result, micromasking-created nodules are avoided.

FIG. 2 shows a flowchart illustrating the process flow according to a preferred embodiment wherein the dopant material is chlorinated (brominated) during the patterning of the gate electrode. The description below is illustrated for patterning of a gate electrode structure but it must be clear that the method according to preferred embodiments is applicable to pattern any silicon and/or germanium comprising layer comprising a minor concentration of one or more Lanthanide elements (e.g. <1%) as long as the lanthanide element forms (water) soluble halides. FIG. 3 illustrates schematically the individual steps after providing a substrate with gate dielectric layer and doped gate electrode layer and having a mask on top of the gate electrode layer to pattern the gate structure (according to the dry/wet/dry approach of preferred embodiments).

The method starts with providing a substrate 1, most preferred the substrate 1 is a semiconductor substrate such as a Si wafer comprising active areas (e.g. source and drain). Onto the substrate 1 a gate dielectric layer 2 is deposited e.g. a silicon dioxide layer, and/or a silicon oxynitride layer (with a thickness of e.g. 2 nm) and/or a high-k layer. Optionally an interlayer can be deposited onto the substrate prior to the deposition of a gate dielectric layer 2, the interlayer can be e.g. a thermally grown $SiO_2$ layer obtained after a thermal anneal or an HF dip (e.g. a dip in a 2% HF solution). Onto the gate dielectric layer 2 a gate electrode layer 3 is deposited, the gate electrode layer 3 is preferably formed with a thickness of about 100 nm (range 50 nm up to maximum 200 nm), and is preferably formed of poly-crystalline silicon.

In a next step the gate electrode layer 3 is doped with a suitable dopant element. Preferably the dopant element is a Lanthanide and more preferred the dopant element is Ytterbium (Yb). For example a poly-silicon gate layer is doped with Yb using 40 keV at $4E^{15}$ $cm^{-2}$ or $8E^{15}$ $cm^{-2}$. After doping the gate electrode layer 6 the dopant element is situated in the upper part of the gate electrode layer (or in other words near the top surface).

In a next step, a mask layer is deposited onto the gate electrode layer 5, most preferred the mask layer is a photosensitive imaging layer(s) 5, and optionally there can be a hardmask layer 4 such as silicon nitride deposited before the deposition of the photosensitive imaging layer(s) 5. A gate pattern is then transferred into the photosensitive imaging layer(s) 5 and hardmask layer 4 by means of photolithographic patterning.

In a next step the (doped) gate electrode layer 6 is subjected to Cl or Br comprising plasma 21, preferably the Cl or Br comprising plasma such that the dopant element is chlorinated and/or brominated. However, the overlying mask structure prohibits the in-situ plasma from chlorination (bromination) of the dopants in that region. Most preferred chlorinated and/or brominated dopants are formed in the gate electrode layer 6 which are water soluble. As illustrated in FIG. 3, the exposed portions of the (doped) gate electrode layer 6 are subjected to a plasma comprising Cl and/or Br species that cause chlorination/bromination of the dopant elements in the gate electrode layer. The time and exposure of the chlorination/bromination step is such that complete chlorination/bromination of the dopants of the exposed portions of the gate electrode layer is obtained. Most preferred the step of subjecting the exposed areas of the gate electrode layer is performed in a reactive ion etch chamber e.g. in a 2300 Versys etch chamber from Lam Research whereby the substrate bias during the exposure step is different from zero to avoid lateral exposure, a suitable substrate bias can be 90 W. The exposure time is at least 10 seconds.

In a next step the chlorinated and/or brominated dopants are removed from the exposed areas of the gate electrode layer 6 by means of a wet removal step 22, most preferred the wet removal step is a water rinse. Alternatively the wet removal step uses an acidified water solution. During the wet removal step, the non exposed parts of the gate electrode layer 3 (situated under the mask layer(s) 4,5 are not etched because the non-chlorinated dopants are not (water) soluble.

An anisotropical dry-etching process 23 is then applied to etch (complete) a gate structure 9 in the gate electrode layer 3 and gate dielectric layer 2. The plasma used to pattern the gate electrode layer 3 or in other words to perform the main etch step 25 is a conventional plasma used to pattern e.g. poly crystalline silicon. The main etch plasma (to define 80% of the gate electrode profile) for etching of the undoped Poly-Si preferably comprises HBr, $Cl_2$, $CF_4$ and/or $O_2$ as etch gases.

After the main gate etch step a soft landing (SL) step 26 is performed whereby the etch plasma is tuned to be selective towards the underlying dielectric. This SL plays a key role for determining the bottom profile of the gate. In case the underlying gate dielectric is SiON, the SL etch plasma preferably contains HBr and $O_2$. Additionally an extra overetch (OE) step 27 can be applied after the SL step to clean up (Si) etch residues. The anisotropical dry-etching process further comprises the step of etching 28 the gate dielectric layer 2 using the above mentioned mask (gate pattern) to define a complete gate structure 9. In all the above plasma compositions, the plasma can further comprise inert compounds. Finally a resist strip or removal of the mask structure 4,5 is applied.

An anneal used to diffuse the dopants over the poly-Si layer can not be applied before the step of patterning the gate electrode layer without affecting the gate profile and needs to be applied after the step of patterning the gate electrode. The thermal anneal step 29 must performed after the step of removing the chlorinated (brominated) dopants in the exposed areas. The anneal can be performed at 950° C. for 30s in $N_2$ ambient obtained.

Preferably, the Cl (Br) comprising plasma used to perform the chlorination of the dopant element such as Yb has a plasma power in the range of 100 W up to 1200 W. More preferred the plasma power is around 250 W.

Preferably, the pressure in the plasma chamber used to perform the chlorination of the dopant element (during patterning or after patterning of the gate electrode) is in the range of minimum 0.666 Pa (5 mT) and maximum 10.665 Pa (80 mT). More preferred the pressure is 0.799 Pa (6 mT).

Preferably, the chlorine comprising plasma used to perform the chlorination of the dopant element (during patterning or after patterning of the gate electrode) has a plasma temperature below 100° C. and most preferred the plasma temperature during dry-etch patterning is around 60° C.

The preferred time of exposure of the gate electrode layer to the Cl (Br) comprising plasma is dependent on the dopant concentration and the plasma settings such as substrate bias, etc. A higher substrate bias will give more ion bombardment and can therefore reduce thickness of the gate electrode layer during exposure to the Cl (Br) plasma.

If needed the sequence of first a step of chlorination (bromination) in a Cl and/or Br comprising plasma followed by the step of removing the chlorinated (brominated) dopants in the exposed areas of the gate electrode layer can be repeated until complete removal (selective) of the dopants in the exposed areas of the gate electrode layer is obtained.

It is further an aim to disclose the use of a Cl or Br comprising plasma for the chlorination (bromination) of the dopants in the exposed areas of e.g. a gate electrode layer such that a selective removal of dopants in the exposed areas of the gate electrode layer towards silicon based material (e.g. polysilicon) is possible. The removal can be performed using a wet removal step, most preferred the wet removal step is a water rinse.

EXAMPLES

Example 1

Conventional Patterning Scheme (Prior Art) for Patterning of Poly-Si Doped Gates with Ytterbium The Poly-Si gates are 100 nm thick and are patterned using a 80 nm PECVD oxide hard mask. Deep UV resist (193 nm wavelength) is used in combination with an organic bottom anti-reflective coating (BARC) with thickness of 230 nm and 77 nm, respectively. 2 nm SiON is used as gate dielectric. Poly-Si was implanted either with Al (8 keV or 10 keV at $4E^{15}$ cm$^{-2}$) or Yb (40 keV at $4E^{15}$ cm$^{-2}$ or $8E^{15}$ cm$^{-2}$). The dry etch experiments were performed in a 2300 Versys etch chamber from Lam Research on 200 mm wafers.

The Poly-Si gates are 100 nm thick and are patterned using a 80 nm PECVD oxide hard mask. Deep UV resist (193 nm wavelength) is used in combination with an organic bottom anti-reflective coating (BARC) with thickness of 230 nm and 77 nm, respectively. 2 nm SiON is used as gate dielectric. Poly-Si was implanted either with Al (8 keV or 10 keV at $4E^{15}$ cm$^{-2}$) or Yb (40 keV at $4E^{15}$ cm$^{-2}$ or $8E^{15}$ cm$^{-2}$). The dry etch experiments were performed in a 2300 Versys etch chamber from Lam Research on 200 mm wafers.

The poly-Si gate etch recipe contains three basic steps: a Main Etch (ME), a Soft Landing (SL) and an OverEtch (OE) step. The ME defines 80% of the gate. For etching of the undoped Poly-Si it contains HBr, $Cl_2$, $CF_4$ and $O_2$ as etch gases. The gate etch is finished by the SL step containing HBr and $O_2$. The SL step is tuned to be selective towards the underlying dielectric. This SL plays a key role for determining the bottom profile of the gate. OE is used to clean up Si residues and does not affect the poly-Si gate profile formed during the two previous steps.

Poly-Si gates doped with Al can be etched using the conventional recipe developed for undoped poly-Si gates. Gates with straight profile are obtained. An anneal at 950° C. for 30s in $N_2$ ambient to diffuse the dopants over the poly-Si layer can be applied before the gate etch without affecting the gate profile obtained.

When the Yb-doped poly-Si gates are etched using conventional poly-Si gate etch recipe, Si residues as well as pitting through the gate dielectric are observed as illustrated by FIG. 1A. These Si residues are likely due to micro masking caused by the Yb atoms located shallow under the oxide hard mask. If an anneal at 950° C. for 30s is applied to distribute the Yb atoms in the full poly-Si layer, the micro masking becomes worse (FIG. 1B). Si pillars as high as the gate height are seen after the gate etch.

Example 2

Role of Wet Etching Step in the Patterning Scheme for Patterning Poly-Si Doped with Ytterbium To verify the role of the wet etch in the patterning of Yb doped poly-Si, two wafers with the same implant energy of 4 keV but double dose of Yb ($8E^{15}$ cm$^{-2}$) were etched. The first wafer is etched using the fully dry approach with the Main Etch containing only HBr and $Cl_2$. The second wafer is patterned using the dry-wet-dry etch approach. The dry etch times are kept the same for both wafers. Specifically, the total ME time (time before wet etch plus time after wet etch) is kept equal to the ME time applied for the dry-only approach. Severe micro masking is present when the dry-only approach is used while limited residues are observed when the intermediate wet etch is employed (FIG. 3). This confirms that the acidified water solution plays a crucial role in removing of the Yb bromides and/or Yb chlorides formed during the ME step.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for removing at least part of a deposited layer selectively over a substrate underneath, the deposited layer comprising at least one element which is not etchable, the method comprising the steps of:

depositing a layer comprising at least one element which is able to form at least one of a water-soluble chloride and a water-soluble bromide onto a substrate;

halogenating the element by exposing the deposited layer to a dry etch plasma comprising at least one halogen selected from the group consisting of chlorine and bromine;

removing the halogenated element using a water based wet etch step; and performing a dry etch step to etch a remaining part of the deposited layer.

2. The method of claim 1, further comprising, after the step of depositing the layer, a step of doping the deposited layer to incorporate at least one element in the deposited layer.

3. The method of claim 2, wherein doping comprises ion implantation.

4. The method of claim 1, wherein the element is a Lanthanide element which is present in the deposited layer in a concentration of less than about 1% of a total composition of the deposited layer.

5. The method of claim 1, wherein removing the halogenated element comprises patterning of a structure, and wherein the method further comprises, after the step of depositing the layer, the step of:

depositing at least one photosensitive imaging layer and transferring the photolithographic pattern in the imaging layer to define a structure and to expose only parts of the deposited layer;

and further comprises, after the water based wet etch step, the steps of:

performing a dry etch step to etch a remaining part of the deposited layer to define a final structure; and annealing the final structure such that the element is equally distributed into the final structure.

6. The method of claim 5, wherein removing the halogenated elements comprises patterning of a gate structure, wherein the deposited layer is a gate electrode layer, and wherein the method further comprises, before the step of depositing the gate electrode layer, the step of depositing a gate dielectric layer.

7. The method of claim 6, wherein the deposited layer is a poly-crystalline silicon layer for use as a gate electrode layer, and wherein the gate dielectric layer is comprises at least one layer selected from the group consisting of a high-k layer, a $SiO_2$ layer, and a SiON layer.

8. The method of claim 6 further comprising, after the step of depositing a gate dielectric layer, the step of:

performing a dry etch step to etch the gate dielectric layer to complete a gate structure.

9. The method of claim 5, wherein the step of annealing is performed using a thermal anneal at 950° C.

10. The method of claim 1, wherein the plasma comprises at least one of $Cl_2$ and $BCl_3$.

11. The method of claim 1, wherein the plasma comprises at least one of HBr and $Br_2$.

12. The method of claim 1, wherein the element is a Lanthanide selected from the group consisting of La, Ce, Pr, Nd, Pm, Sm, Eu, Gd, Tb, Dy, Ho, Er, Tm, Yb and Lu.

13. The method of claim 1, wherein the element is Yb.

14. The method of claim 1, whereby the substrate is a silicon wafer.

15. Use of the method of claim 1 to fabricate a semiconductor device comprising a gate structure.

* * * * *